US010269893B2

(12) United States Patent
Cui et al.

(10) Patent No.: US 10,269,893 B2
(45) Date of Patent: Apr. 23, 2019

(54) METHOD AND SYSTEM FOR MOM CAPACITANCE VALUE CONTROL

(71) Applicant: SHANGHAI HUALI MICROELECTRONICS CORPORATION, Shanghai (CN)

(72) Inventors: Yeqing Cui, Shanghai (CN); Ran Huang, Shanghai (CN); Jianning Deng, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/826,726

(22) Filed: Nov. 30, 2017

(65) Prior Publication Data
US 2018/0294330 A1 Oct. 11, 2018

(30) Foreign Application Priority Data

Apr. 10, 2017 (CN) .......................... 2017 1 0229267

(51) Int. Cl.
H01L 49/02 (2006.01)
H01L 21/66 (2006.01)
H01L 21/321 (2006.01)
H01L 21/768 (2006.01)
H01L 21/67 (2006.01)
(Continued)

(52) U.S. Cl.
CPC .......... H01L 28/60 (2013.01); G01R 27/2605 (2013.01); G01R 31/2639 (2013.01); H01L 21/3212 (2013.01); H01L 21/67253 (2013.01); H01L 21/76802 (2013.01); H01L 21/76877 (2013.01); H01L 22/20 (2013.01); H01L 23/5223 (2013.01); H01L 21/2855 (2013.01); H01L 21/2885 (2013.01); H01L 21/28556 (2013.01); H01L 23/528 (2013.01); H01L 23/5226 (2013.01)

(58) Field of Classification Search
CPC ..... H01L 28/60; H01L 23/5223; H01L 22/20; H01L 21/3212; H01L 21/76802; H01L 21/76877; H01L 21/67253; H01L 23/5226; H01L 21/2855; H01L 21/28556; H01L 21/2885; H01L 23/528; G01R 31/2639; G01R 27/2605
See application file for complete search history.

(56) References Cited

U.S. PATENT DOCUMENTS

2013/0244544 A1* 9/2013 Wang ...................... H01L 22/20
451/41

* cited by examiner

Primary Examiner — Karen Kusumakar
(74) Attorney, Agent, or Firm — Tianchen LLC

(57) ABSTRACT

A method for MOM capacitance value control is disclosed. The method comprises: S01: setting a target thicknesses for each metal layers; S02: after forming a current metal layer, measuring a thickness of the current metal layer; when the thickness of the current metal layer is equal to or less than a threshold value, then turning to step S03; S03: calculating multiple capacitance variations related to the current metal layer according to the thickness of the current metal layer; wherein each of the capacitance variation related to the current metal layer is between an actual capacitance value of a MOM capacitor combination associated with the current metal layer and a target capacitance value of the same MOM capacitor combination; S04: calculating updated target thicknesses for all subsequent metal layers according to the capacitance variations related to the current metal layer.

8 Claims, 3 Drawing Sheets

(51) Int. Cl.
G01R 27/26 (2006.01)
G01R 31/26 (2014.01)
H01L 23/522 (2006.01)
H01L 23/528 (2006.01)
H01L 21/285 (2006.01)
H01L 21/288 (2006.01)

METHOD AND SYSTEM FOR MOM CAPACITANCE VALUE CONTROL

CROSS-REFERENCE TO RELATED APPLICATION

This application claims the priority benefit of China application serial no. 201710229267.1, filed Apr. 10, 2017. All disclosure of the China application is incorporated herein by reference.

FIELD OF THE INVENTION

The present invention relates to the field of semiconductor technology, and more particularly to a method and system for MOM capacitance value control through dynamic regulation of metal layer thickness.

BACKGROUND OF THE INVENTION

The metal-oxide-metal (MOM) capacitor has great importance on the performance and yield rate of integrated circuits. The capacitance value of a MOM capacitor is influenced by a combination effect of multiple metal layers, specifically by the total thicknesses of the metal layers. Accordingly, the capacitance value of a MOM capacitor is positively related to the thicknesses of the metal layers within the MOM capacitor, and the capacitance value of the MOM capacitor can be controlled by monitoring and adjusting the thicknesses of the metal layers within the MOM capacitor to reach the target value.

Before the chemical mechanical polishing (CMP) process for Cu BEOL application in sub-55 nm technology, a target thickness, which is a constant value, is set for each metal layer. However, due to the process variation, difference may occur between the actual thickness of the metal layer and the target thickness, which may further result in the following problems.

When the actual thickness of a previous metal layer offsets greatly from its target thickness, or when the total actual thicknesses of the metal layers offsets greatly from the sum of the target thicknesses, if the subsequent metal layers are still processed according to the original pre-set target thicknesses, the total capacitance value of the related MOM capacitor may shift from the target capacitance value.

For example, shifts of the thicknesses of the metal layers toward a same direction may lead to an obvious difference between the capacitance value of the MOM capacitor measured by wafer acceptance test (WAT) and the target capacitance value, so as to increase the standard deviation of the electrical parameters.

Regarding to the CMP process for Cu damascene application, when the actual thickness of the copper layer is greater than the target thickness due to the process variation, rework of the CMP process is required to reduce the exceeded copper. However, the process cost and process time are increased. In another case, if the actual thickness of the copper layer is greater but still within the process window, the rework of the CMP process is not required. However, the total thickness of the subsequent copper layers may shift from the sum of the target thicknesses, which affects the total capacitance value of the MOM capacitor. When the actual thickness of the copper layer is much less than the target thickness due to the process variation, such loss cannot be compensated during the CMP processes for the subsequent copper layers.

SUMMARY OF THE INVENTION

The aim of the invention is to provide a method and system for MOM capacitance value control, which can monitor the MOM capacitance value through dynamic regulation of metal layer thickness.

To achieve these and other advantages and in accordance with the objective of the invention, as embodied and broadly described herein, the invention provides a method for MOM capacitance value control, which comprises the following steps:

S01: setting a target thicknesses for each metal layers;

S02: after forming a current metal layer, measuring a thickness of the current metal layer; when the thickness of the current metal layer is equal to or less than a threshold value, then turning to step S03;

S03: calculating multiple capacitance variations related to the current metal layer according to the thickness of the current metal layer; wherein each of the capacitance variation related to the current metal layer is between an actual capacitance value of a MOM capacitor combination associated with the current metal layer and a target capacitance value of the same MOM capacitor combination;

S04: calculating updated target thicknesses for all subsequent metal layers according to the capacitance variations related to the current metal layer to reduce total variations between the actual capacitance values of the MOM capacitor combinations associated with the current metal layer and the target capacitance values of the same MOM capacitor combinations.

Preferably, when the thickness of the current metal layer is greater than the threshold value, then performing a chemical mechanical polishing process to the current metal layer until the thickness of the current metal layer is equal to or less than the threshold value.

Preferably, each MOM capacitor combination associated with the current metal layer is consisted of multiple MOM capacitors of multiple metal layers including the current metal layer; the capacitance variations related to the current metal layer and their compensation values are represented as the following first equation:

$$\begin{cases} C_1: \sum_{l_1}^{p} S_{n_1} \Delta X_{n_1} = -\sum_{p+1}^{m_1} S_{n_1'} \Delta X_{n_1'} \\ \quad \vdots \\ \quad \vdots \\ C_k: \sum_{l_k}^{p} S_{n_k} \Delta X_{n_k} = -\sum_{p+1}^{m_k} S_{n_k'} \Delta X_{n_k'} \end{cases}$$

wherein $C_1$ to $C_k$ are MOM capacitor combinations associated with the current $p^{th}$ metal layer, $\Delta X$ is the variation between an actual thickness of a metal layer and a target thickness of the metal layer; S is the sensitivity of the metal layer to the MOM capacitor value; $l_1$ to $l_k$ are metal layers each of which is a bottom metal layer of all the metal layers consisting the corresponding MOM capacitor combination; $m_1$ to $m_k$ are metal layers each of which is a top metal layer of all the metal layers consisting the corresponding MOM capacitor combination.

Preferably, step S4 further comprises the following steps:

S41: establishing a second equation for each MOM capacitor combination associated with the current metal layer which represents the relationship between different thickness variations of subsequently formed metal layers included in the MOM capacitor combination relative to their target thicknesses, the second equation is as follows:

$$\Delta X_{p+1} : \Delta X_{p+2} : \ldots : \Delta X_{m-1} : \Delta X_m = C_{p(p+1)} : C_{p(p+2)} : \ldots : C_{p(m-1)} : C_{pm};$$

wherein Cp is the process capability index of the metal layer;

S42: calculating thickness variations of subsequently formed metal layers corresponding to different MOM capacitor combinations according to the first equation and the second equation;

S43: for each subsequently formed metal layer, defining a collection of candidate thickness variation values according to their different thickness variations corresponding to different MOM capacitor combinations including the subsequently formed metal layer;

S44: selecting an optimal value from the collection of candidate thickness variation values for each subsequently formed metal layer, so as to obtain the updated target thickness for all the subsequently formed metal layers.

Preferably, step S43 further comprises the following steps:

S431: for each subsequently formed metal layer, selecting a minimum value and a maximum value of the thickness variations calculated in step S42 and defining a first thickness variation range represented by the following third equation:

$$\Delta X_n \in [\mathrm{Min}(\Delta X_{nC_1}, \ldots, \Delta X_{nC_k}), \mathrm{Max}(\Delta X_{nC_1}, \ldots, \Delta X_{nC_k})];$$

S432: establishing the fourth and fifth equations to define a second thickness variation range and a third thickness variation range for each subsequently formed metal layer:

$$LSL_n < X_n + \Delta X_n < USL_n (n=2 \ldots m);$$

$$\int_{LSL_n}^{X_n + \Delta X_n} P(X_n + \Delta X_n) d(X_n + \Delta X_n) \geq 0.997 (n=2 \ldots m);$$

wherein, LSLn is the lower specification limit for the thickness of the $n^{th}$ metal layer, USLn is the upper specification limit for the thickness of the $n^{th}$ metal layer, $X_n + \Delta X_n$ is the updated target thickness of the $n^{th}$ metal layer, $P(X_x + \Delta X_n)$ is the probability density function of the updated target thickness of the $n^{th}$ metal layer;

S433: calculating a maximum thickness variation value, a minimum thickness variation value, and multiple other thickness variation values therebetween by intersection of the first thickness variation range, the second thickness variation range and the third thickness variation range according to the sixth equation; wherein, the maximum thickness variation value, the minimum thickness variation value, and the multiple other thickness variation values form the collection of candidate thickness variation values.

Preferably, step S44 comprises calculating arithmetic mean values of different capacitance off-target factors corresponding to different MOM capacitor combinations associated with the current metal layer by selecting different values from the collections of candidate thickness variation values of different subsequently formed metal layers, and obtaining the updated target thicknesses of the subsequent metal layers according to optimal candidate thickness variation values of different subsequently formed metal layers which are obtained when the arithmetic mean value is minimum; the optimal candidate thickness variation values satisfy the following seventh equation:

$$(\Delta X_{p+1}, \ldots, \Delta X_n) = (z_{p+1}, \ldots, z_n),$$

$$\text{when } \frac{\sum_{1}^{k} Ca_x(X_l + \Delta X_l, \ldots, X_{p+1} + z_{p+1}, \ldots, X_m + z_m)}{k} =$$

$$\mathrm{Min}\left(\frac{\sum_{1}^{k} Ca_x(X_l + \Delta X_l, \ldots, X_{p+1} + z_{p+1}, \ldots, X_m + z_m)}{k}\right)$$

$$(p = 1 \ldots n-1, x = 1 \ldots k);$$

$$Ca_x(X_l + z_l, \ldots, X_{p+1} + z_{p+1}, \ldots, X_m + z_m) =$$

$$\frac{|C_{x\,target} - C_x(X_l + z_l, \ldots, X_{p+1} + z_{p+1}, \ldots, X_m + z_m)|}{(USL_x - LSL_x)/2};$$

wherein $Ca_x(X_l + z_l, \ldots, X_{p+1} + z_{p+1}, \ldots, X_m + z_m)$ are capacitance off-target factors of different metal layers from the bottom metal layer "l" to the top metal layer "m" corresponding to the MOM capacitor combination Cx; $C_x(X_l + z_l, \ldots, X_{p+1} + z_{p+1}, \ldots, X_m + z_m)$ is the capacitance value of the MOM capacitor combination Cx when the thicknesses of the metal layers in the MOM capacitor are zl to zm.

Preferably, the metal layer is formed by the following steps:

depositing a dielectric layer and forming vias and trenches in the dielectric layer;

depositing a metal layer by PVD or CVD or electroplating;

performing CMP to pattern structures formed after the above steps.

Preferably, the thickness of the current metal layer is measured by an optical microscope, a spectroscopic ellipsometer or a scanning electron microscope.

To achieve these and other advantages and in accordance with the objective of the invention, the present invention further provides a system for MOM capacitance value control. The system comprises:

a storage module for storing target thicknesses for all metal layers;

a measurement module for measuring a thickness of a current metal layer after forming the current metal layer;

a determination module for outputting a calculation signal when the thickness of the current metal layer is equal to or less than a threshold value or outputting a rework signal when the thickness of the current metal layer is greater than the threshold value;

a calculation module for responding to the calculation signal to calculate multiple capacitance variations related to the current metal layer according to the thickness of the current metal layer; wherein each of the capacitance variation related to the current metal layer is between an actual capacitance value of a MOM capacitor combination associated with the current metal layer and a target capacitance value of the same MOM capacitor combination; the calculation module further calculates updated target thicknesses for all subsequent metal layers according to the capacitance variations related to the current metal layer to reduce total variations between the actual capacitance values of the MOM capacitor combinations associated with the current metal layer and the target capacitance values of the same MOM capacitor combinations.

Preferably, each MOM capacitor combination associated with the current metal layer is consisted of multiple MOM capacitors of multiple metal layers including the current metal layer; the capacitance variations related to the current metal layer and their compensation values are represented as the following first equation:

$$\begin{cases} C_1: \sum_{l_1}^{p} S_{n_1} \Delta X_{n_1} = -\sum_{p+1}^{m_1} S_{n'_1} \Delta X_{n'_1} \\ \vdots \\ C_k: \sum_{l_k}^{p} S_{n_k} \Delta X_{n_k} = -\sum_{p+1}^{m_k} S_{n'_k} \Delta X_{n'_k} \end{cases} ;$$

wherein $C_1$ to $C_k$ are MOM capacitor combinations associated with the current $p^{th}$ metal layer, $\Delta X$ is the variation between an actual thickness of a metal layer and a target thickness of the metal layer; S is the sensitivity of the metal layer to the MOM capacitor value; $l_1$ to $l_k$ are metal layers each of which is a bottom metal layer of all the metal layers consisting the corresponding MOM capacitor combination; $m_1$ to $m_k$ are metal layers each of which is a top metal layer of all the metal layers consisting the corresponding MOM capacitor combination.

Preferably, the calculation module is configured to:

establish a second equation for each MOM capacitor combination associated with the current metal layer which represents the relationship between different thickness variations of subsequently formed metal layers included in the MOM capacitor combination relative to their target thicknesses, the second equation is as follows:

$$\Delta X_{p+1} : \Delta X_{p+2} : \ldots : \Delta X_{m-1} : \Delta X_m = C_{p(p+1)} \cdot C_{p(p+2)} \cdot \ldots \cdot C_{p(m-1)} \cdot C_{pm};$$

wherein Cp is the process capability index of the metal layer;

calculate thickness variations of subsequently formed metal layers corresponding to different MOM capacitor combinations according to the first equation and the second equation;

for each subsequently formed metal layer, defines a collection of candidate thickness variation values according to their different thickness variations corresponding to different MOM capacitor combinations including the subsequently formed metal layer;

select an optimal value from the collection of candidate thickness variation values for each subsequently formed metal layer, so as to obtain the updated target thickness for all the subsequently formed metal layers.

Preferably, the calculation module defines the collection of candidate thickness variation values by:

selecting a minimum value and a maximum value of the thickness variations and defining a first thickness variation range represented by the following third equation filtering some of the candidate target thickness according to constraint equations as follows: $\Delta X_n \in [\text{Min}(\Delta X_{nC_1}, \ldots, \Delta X_{nC_k}), \text{Max}(\Delta X_{nC_1}, \ldots, \Delta X_{nC_k})]$;

establishing fourth and fifth equations to define a second thickness variation range and a third thickness variation range for each subsequently formed metal layer:

$$LSL_n < X_n + \Delta X_n < USL_n (n=2 \ldots m);$$

$$\int_{LSL_n}^{X_n + \Delta X_n} P(X_n + \Delta X_n) d(X_n + \Delta X_n) \geq 0.997 (n=2 \ldots m);$$

wherein, $LSL_n$ is the lower specification limit for the thickness of the $n^{th}$ metal layer, $USL_n$ is the upper specification limit for the thickness of the $n^{th}$ metal layer, $X_n + \Delta X_n$ is the updated target thickness of the $n^{th}$ metal layer, $P(X_n + \Delta X_n)$ is the probability density function of the updated target thickness of the $n^{th}$ metal layer;

calculating a maximum thickness variation value, a minimum thickness variation value, and multiple other thickness variation values therebetween by intersection of the first thickness variation range, the second thickness variation range and the third thickness variation range; wherein, the maximum thickness variation value, the minimum thickness variation value, and the multiple other thickness variation values form the collection of candidate thickness variation values.

Preferably, the calculation module calculates arithmetic mean values of different capacitance off-target factors corresponding to different MOM capacitor combinations associated with the current metal layer by selecting different values from the collections of candidate thickness variation values of different subsequently formed metal layers, and obtains the updated target thicknesses of the subsequent metal layers by adding optimal candidate thickness variation values of different subsequently formed metal layers to the pre-set target thickness of the subsequently formed metal layers respectively, wherein the optimal candidate thickness variation values are obtained when the arithmetic mean value is minimum; the optimal candidate thickness variation values satisfy the following seventh equation and eighth equation:

$$(\Delta X_{p+1}, \ldots, \Delta X_n) = (z_{p+1}, \ldots, z_n),$$

$$\text{when } \frac{\sum_{1}^{k} Ca_x(z_l, \ldots, z_m)}{k} = \text{Min}\left(\frac{\sum_{1}^{k} Ca_x(z_l, \ldots, z_m)}{k}\right), p \in (1, n-1), x \in (1, k)$$

$$Ca_x(z_l, \ldots, z_m) = \frac{|C_{x\,target} - C_x(z_l, \ldots, z_m)|}{(USL_x - LSL_x)/2}$$

Wherein $Ca_x(z_l, \ldots, z_m)$ are capacitance off-target factors of different metal layers from the bottom metal layer "l" to the top metal layer "m" corresponding to the MOM capacitor combination Cx; $C_x(z_l, \ldots, z_m)$ is the capacitance value of the MOM capacitor combination Cx when the thickness of the metal layers in the MOM capacitor are zl to zm; "z" is the thickness of the metal layer which is the sum of the pre-set target thickness and the thickness variation.

According to the above technical solution, a real-time thickness measurement is performed to the current metal layer after the formation of the current metal layer, and the target thicknesses of metal layers to be formed later are adjusted according to the thickness variation between the actual measured thickness and the target thickness of the current metal layer. As a result, the total thickness of all the metal layers meets the requirement and the MOM capacitance value can be controlled within the target capacitance range.

DETAILED DESCRIPTION OF THE EMBODIMENTS

Reference will now be made in detail to the present preferred embodiments of the invention, examples of which are illustrated in the accompanying drawings. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

Now, the present invention is more specifically described with reference to accompanying drawings, which are schematic and which are not intended to be drawn to scale.

Figure 1:
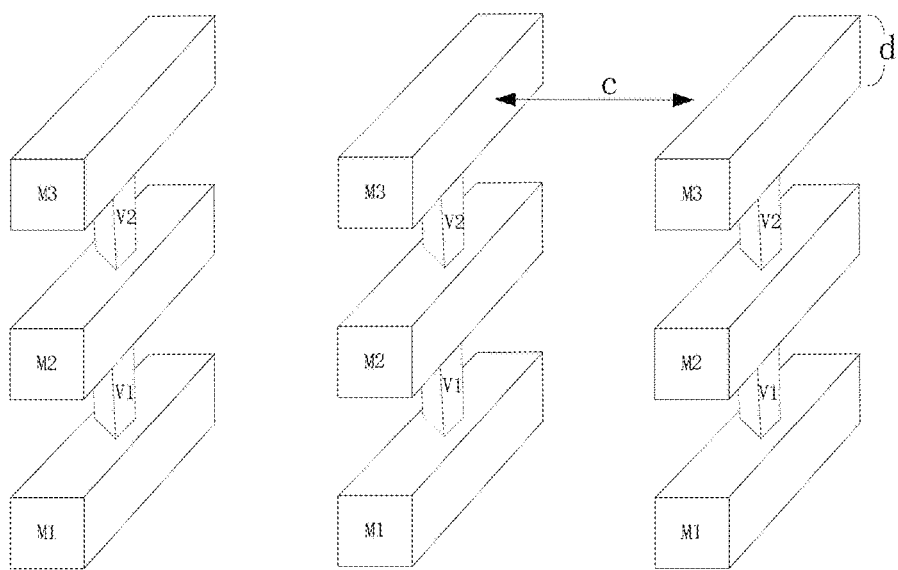
FIG. 1 is a diagram illustrating multiple metal layers and MOM capacitors in the metal layers.

Please refer to FIG. 1. FIG. 1 illustrates three interconnected metal layers and MOM capacitors in these three metal layers. Dielectric layers (not shown) are provided between the metal layers M1, M2, M3 in which vias are formed. Each of the vias V1, V2 communicates two adjacent metal layers. In a same metal layer, there exists multiple metal interconnects. Adjacent metal interconnects and the dielectric therebetween form a MOM capacitor in the metal layer. However, the total thickness of the metal layers M1, M2, M3 affects the capacitance values of the MOM capacitors in the metal layers. In order to accurately regulate the total MOM capacitance value to the target capacitance value, the present invention provides a method for MOM capacitance value.

Figure 2:
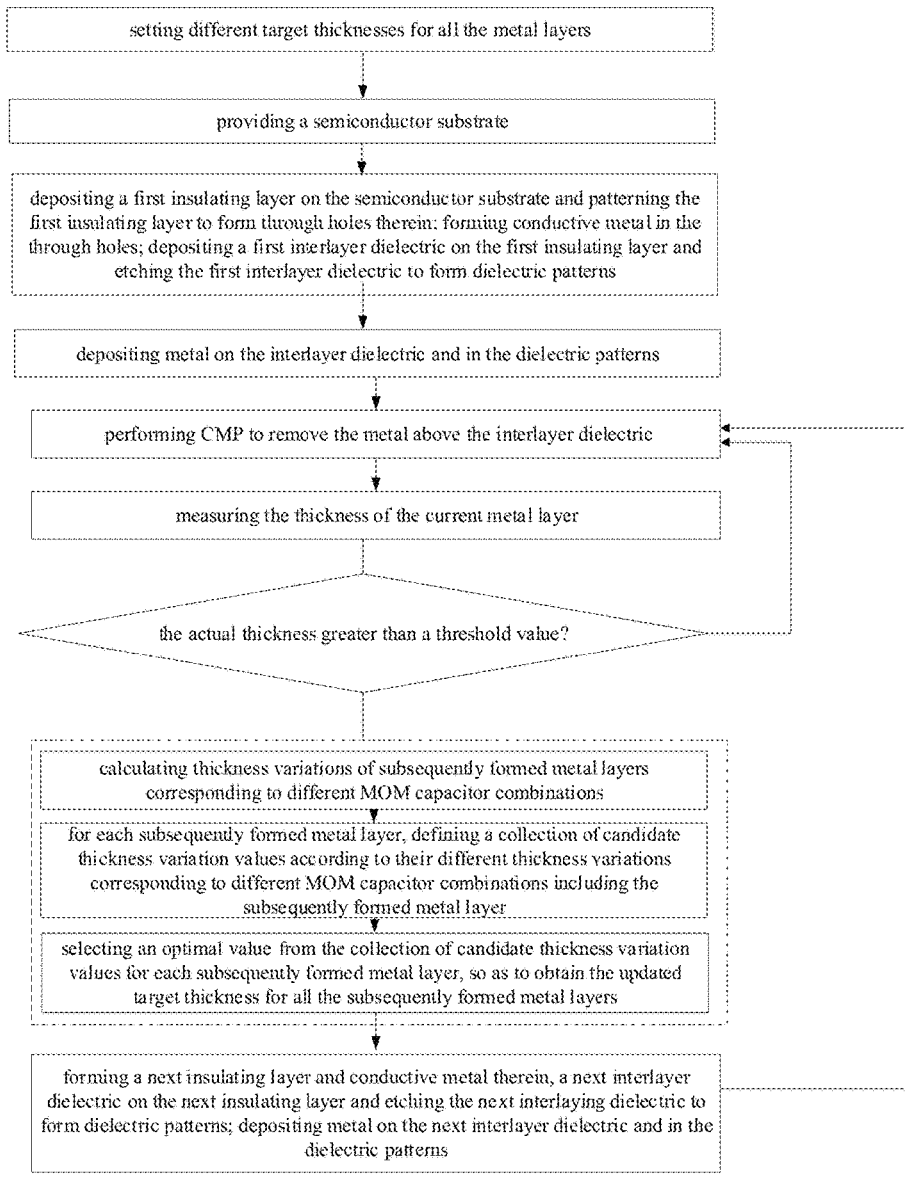
FIG. 2 is a flow chart illustrating a method for MOM capacitance value control according to an embodiment of the present invention.

As shown in FIG. 2, the method for MOM capacitance value comprises the following steps.

Firstly, different target thicknesses are set for all the metal layers. Then, a semiconductor substrate is provided, on which an interconnect structure including the metal layers will be formed. The semiconductor substrate can be a silicon substrate with FEOL devices.

The interconnect structure is formed by the following steps.

Depositing a first insulating layer on the semiconductor substrate and patterning the first insulating layer to form through holes therein. Forming conductive metal in the through holes. Depositing a first interlayer dielectric on the first insulating layer and etching the first interlayer dielectric to form dielectric patterns. The dielectric patterns include trenches and vias to form first metal interconnects. Then depositing metal on the first interlayer dielectric and in the dielectric patterns. Specifically, metal can be deposited in the tranches and vias by CVD or PVD, so as to form the first metal interconnects. If the metal is copper, then it can also be deposited through Cu electroplating. It is noted that, the thickness of the first interlayer dielectric should be consistence with the target thickness of the first metal layer.

After that, the deposited metal is planarized. Specifically, CMP is performed to remove the metal above the first interlayer dielectric. In an ideal state, the height of the trenches and vias is equal to the target thickness of the first metal layer, the top of the metal is coplanar with the top of the first interlayer dielectric. So far, the first metal layer is formed. Then, a second insulating layer is deposited and patterned, a second interlayer dielectric is deposited and second metal interconnects are formed therein, the second metal interconnects are planarized to form a second metal layer. And so on, all the metal layers are formed to accomplish the fabrication of the interconnect structure.

However, in the actual process, the actual thickness of the metal layer after CMP is not equal to or close to the target thickness of the metal layer, which leads to capacitance variations of the MOM capacitor. It is noted that, for a multi-layer metal interconnect structure, there provides different MOM capacitor combinations. For example, for an interconnect structure having 5 metal layers, MOM capacitor combinations may include MOM 1-5, MOM 1-3, MOM 2-4, MOM 3-5, etc. The MOM capacitor combinations associated with a certain metal layer refers to the MOM capacitor combinations including a MOM capacitor formed by or containing the metal layer. For example, for an interconnect structure having 5 metal layers, MOM capacitor combinations associated with the metal layer 2 may include MOM capacitor combinations MOM 1-5, MOM 1-3, MOM 2-4, etc.

In order to overcome the above deficiency, according to the present invention, after the formation of each metal layer, the thickness of the current metal layer is measured. Specifically, optical instruments are utilized to perform thickness measurement. If a test structure is formed at the same time, then a scanning electron microscope is utilized to perform the thickness measurement after the test structure being cut along its section planes.

If the measured thickness of the current metal layer is greater than a threshold value, then the CMP process is reworked until the thickness is less than or equal to the threshold value. If the thickness of the current metal layer is less than or equal to the threshold value, then the target thicknesses of the metal layers to be formed subsequently are re-designed. In the embodiment, the threshold value for the current metal layer is the sum of the target thickness of the current metal layer and 0.2 standard deviation.

The re-design of the metal layers to be formed subsequently will be described as follows.

Firstly, calculating multiple capacitance variations related to the current metal layer according to at least the thickness of the current metal layer, each capacitance variation related to the current metal layer is between an actual capacitance value of a MOM capacitor combination associated with the current metal layer and a target capacitance value of the same MOM capacitor combination. For example, for the current metal layer M3, the MOM capacitor combinations associated with the metal layer 3 may include MOM capacitor combinations MOM 1-5, MOM 3-5, MOM 2-4, etc. For the MOM capacitor combination MOM 3-5, which is combined by the MOM capacitor M3, the MOM capacitor M4 and the MOM capacitor M5, the capacitance variation caused by the fabricated metal layer is related to the thickness of the metal layer M3, while for the MOM capacitor combination MOM 1-5, the capacitance variation caused by the fabricated metal layers is related to the thicknesses of the metal layers M1-M3.

Although the MOM capacitance sensitivity to each metal layer is different, the value of a MOM capacitance formed by a metal layer is always linear with the thickness of the metal layer, which satisfies the linear equation: $MOM\_C = Sn * Mn\_thickness + b$. Herein, $MOM\_C$ is the value of a MOM capacitance, $Sn$ is the MOM capacitance sensitivity to the $n^{th}$ metal layer, which represents the capacitance variation ratio with respect to the thickness of the $n^{th}$ metal layer and is the slope of the linear equation, Mn_thickness is the thickness of the $n^{th}$ metal layer, b is a constant.

From above, it is known that for a MOM capacitor combination M1-Mm, the capacitance variation after fabricating the $n^{th}$ metal layer should satisfy the following equation:

$$\Delta C_n = \Sigma_{i=1}^{n}(S_i \Delta X_i);$$

Wherein $\Delta C_n$ is the capacitance variation after fabricating the $n^{th}$ metal layer, Si is the MOM capacitance sensitivity to the $i^{th}$ metal layer, $\Delta X_i$ is the thickness variation between the actual thickness and the target thickness of the $i^{th}$ metal layer.

Therefore, for the MOM capacitor combination M1-M5, the capacitance variation after fabricating the metal layer M3 is $\Delta C_{3(M1-M5)} = \Sigma_1^3(S_i \Delta X_i)$.

Similarly, other MOM capacitor combinations associated with the current metal layer may have also have respective capacitance variations after fabricating the current metal layer.

For a MOM capacitor combination M1-Mm, the total capacitance variation generated after fabricating the $n^{th}$ metal layer is summed to be $\Sigma_{i=1}^{n}(S_i \Delta X_i)$, which should be compensated by the capacitance variation caused by the subsequently formed metal layers from the $n+1^{th}$ metal layer to the $m^{th}$ metal layer. That is, $$\Sigma_{j=n+1}^{m}(S_j \Delta X_j) = -\Sigma_{i=1}^{n}(S_i \Delta X_i), (n=1, \ldots, m) \quad (1)$$

For example, for the MOM capacitor combination M1-M5, $\Delta C_{3(M1-M5)} = S_1\Delta X_1 + S_2\Delta X_2 + S_3\Delta X_3 = (S_4\Delta X_4 S_5\Delta X_5)$.

From above, it is known that assuming the current metal layer is the $p^{th}$ metal layer, and k number of MOM capacitor combinations are associated with the $p^{th}$ metal layer, then the capacitance variations of the k number of MOM capacitor combinations compared with their target capacitance values satisfy the following equation (1):

$$\begin{cases} C_1: \sum_{l_1}^{p} S_{n_1}\Delta X_{n_1} = -\sum_{p+1}^{m_1} S_{n'_1}\Delta X_{n'_1} \\ \vdots \\ C_k: \sum_{l_k}^{p} S_{n_k}\Delta X_{n_k} = -\sum_{p+1}^{m_k} S_{n'_k}\Delta X_{n'_k} \end{cases} \quad (1)$$

wherein $C_1$ to $C_k$ are MOM capacitor combinations associated with the current $p^{th}$ metal layer, $\Delta X$ is the variation between an actual thickness of a metal layer and a target thickness of the metal layer; S is the sensitivity of the metal layer to the MOM capacitor value; $l_1$ to $l_k$ are metal layers each of which is a bottom metal layer of all the metal layers consisting the corresponding MOM capacitor combination; $m_1$ to $m_k$ are metal layers each of which is a top metal layer of all the metal layers consisting the corresponding MOM capacitor combination.

Then, updated target thicknesses for all subsequent metal layers are calculated according to the capacitance variations related to the current metal layer.

Specifically, an equation (2) is established for each MOM capacitor combination associated with the current metal layer. The equation (2) represents the relationship between different thickness variations of subsequently formed metal layers included in the MOM capacitor combination relative to their target thicknesses, the second equation is as follows:

$$\Delta X_{p+a}:\Delta X_{p+2}: \ldots \Delta X_{m-1}:\Delta X_m = C_{p(p+1)}:C_{p(p+2)}: \ldots :C_{p(m-1)}:C_{pm} \quad (2),$$

wherein Cp is the process capability index of the metal layer, which can be represented as $$Cp_n = \frac{USL_n - LSL_n}{6 * STD_n}$$

Wherein, $LSL_n$ is the lower specification limit for the thickness of the $n^{th}$ metal layer, $USL_n$ is the upper specification limit for the thickness of the $n^{th}$ metal layer, $STD_n$ is the standard deviation of the pre-set target thickness of the $n^{th}$ metal layer.

The equation (2) is used to determine the compensation value for each subsequently formed metal layer according to the process capability index of the metal layer. For example, for the MOM capacitor M1-M5, after the formation of the current metal layer M3, the total thickness is less than the total pre-set target thickness by 500 angstroms. Such thickness loss should be compensated during the fabrication of the metal layers M4 and M5. However, the specific compensation value of the thickness of each subsequently formed metal layer should be determined by the process capability index.

The process capability index is a regular parameter used in the quality control process, which is positively related to the range of the process specification (the upper specification limit minus the lower specification limit). In other words, if the range of the process specification is greater, then the process capability index is higher and the compensation thickness value is more, and vice versa. The process capability index is negatively related with the sextule standard deviation. Statistically, the sextule standard deviation is within 99.7% interval under normal distribution. The greater the sextule standard deviation is, the higher the process capability index is.

From the above two equations, thickness variations of all the subsequent metal layers corresponding to each MOM capacitor combination can be calculated. For a same subsequent metal layer, it may have various thickness variations corresponding to different MOM capacitor combinations, and accordingly it may have various candidate target thicknesses. Therefore, various thickness variations of a same metal layer corresponding to different MOM capacitor combinations should be processed to choose only one updated target thickness for the metal layer.

Specifically, a first thickness variation range for each metal layer to be formed subsequently is defined. The first thickness variation range can be represented by the equation (3):

$$\Delta X_n \in [\text{Min}(\Delta X_{nC_1}, \ldots, \Delta X_{nC_k}), \text{Max}(\Delta X_{nC_1}, \ldots, \Delta X_{nC_k})] \quad (3);$$

Wherein the minimum value of the thickness variation of the metal layer is the lower limit of the first thickness variation range, and the maximum value is the upper limit.

Then equation (4) and equation (5) are established to define a second thickness variation range and a third thickness variation range for each subsequently formed metal layer:

$$LSL_n < X_n + \Delta X_n < USL_n (n=2 \ldots m) \quad (4);$$

$$\int_{LSL_n}^{X_n + \Delta X_n} P(X_n + \Delta X_n) d(X_n + \Delta X_n) \geq 0.997 (n=2 \ldots m) \quad (5);$$

wherein, LSLn is the lower specification limit for the thickness of the $n^{th}$ metal layer, USLn is the upper specification limit for the thickness of the $n^{th}$ metal layer, $X_n+\Delta X_n$ is the updated target thickness of the $n^{th}$ metal layer, $P(X_n+\Delta X_n)$ is the probability density function of the updated target thickness of the $n^{th}$ metal layer;

According to the constraint equation (4), the updated target thickness should be within the specification limit. According to the constraint equation (5), the probability of the normal distribution of the updated target thickness being away from the lower control limit should be greater than 99.7%, that is 3 σ. In other words, the updated target thickness for each metal layer to be formed subsequently should be greater than the lower process window specification limit of the metal layer by at least 3 σ, such that the subsequent metal layer after CMP is likely not to exceed the lower process window specification limit, and the CMP process window is increased for each subsequent metal layer. Herein, the updated target thickness of the $n^{th}$ metal layer should satisfies: Xn+ΔXn−LSL≥3STDn.

Then, by intersection of the equations (3)-(5), as shown in the following equation, the thickness variation values are filtered to form a thickness variation range.

$$\Delta X_{p+1} \in [\text{Min}(\text{equation 3} \cap \text{equation 4} \cap \text{equation 5}), \text{Max}(\text{equation 3} \cap \text{equation 4} \cap \text{equation 5})] (p=1 \ldots n-1) \quad (6)$$

Wherein, the maximum thickness variation value is the upper limit of the thickness variation range, the minimum thickness variation value is the lower limit of the thickness variation range. Furthermore, other thickness variation values each incremented by 10 angstroms between the lower limit and the upper limit are set within the thickness variation range. As a result, the maximum thickness variation value, the minimum thickness variation value, and the multiple other thickness variation values incremented by 10 angstroms form the collection of candidate thickness variation values.

Taking the metal layer M3 as an example, if three thickness variation values are calculated to be A, B, C, respectively corresponding to MOM capacitor combinations MOM M1-M5, MOM M2-M4, and MOM M3-M5, all of which satisfy the three equations (3)-(5), then the three thickness variation values are compared. If C<A<B, then the thickness variation range for the metal layer M3 is from C to B, the collection of the candidate thickness variation values is [C, C+10 Å, C+20 Å, C+30 Å, C+40 Å, … B].

After determining the collection of candidate thickness variation values for a metal layer to be formed subsequently, arithmetic mean values of different capacitance off-target factors corresponding to different MOM capacitor combinations associated with the current metal layer are calculated by selecting different values from the collections of candidate thickness variation values of different subsequently formed metal layers. Herein, the capacitance off-target factor represents the capacitance deviation from the target capacitance, which can be represented as $$Ca = \frac{|C_{x\,target} - C'_x\,\text{target}|}{(USL_x - LSL_x)/2}.$$

Wherein, $C_{Xtarget}$ is the target capacitance of the metal layer, $Cx'_{target}$ is the actual target capacitance of the metal layer. When the metal layer to be formed subsequently is set to have a certain target thickness, each MOM capacitor of the metal layer has a capacitance off-target factor.

Accordingly, corresponding to different candidate thickness variation values of different subsequently formed metal layers, different candidate target thicknesses can be calculated by adding the pre-set target thicknesses to the candidate thickness variation values. Then, with different candidate target thicknesses of different subsequently formed metal layers, various arithmetic mean value of the capacitance off-target factors of all the MOM capacitor combinations can be calculated. The optimal candidate thickness variation values of different subsequently formed metal layers are selected when the arithmetic mean value is minimum, and their corresponding target thicknesses are determined to be the updated target thicknesses for the subsequently formed metal layers.

The optimal candidate thickness variation values of different subsequently formed metal layers can be represented by the following equations:

$$(\Delta X_{p+1}, \ldots, \Delta X_n) = (z_{p+1}, \ldots, z_n), \quad (7)$$

when
$$\frac{\sum_{1}^{k} Ca_x(X_l + \Delta X_l, \ldots, X_{p+1}+z_{p+1}, \ldots, X_m+z_m)}{k} =$$

$$\text{Min}\left(\frac{\sum_{1}^{k} Ca_x(X_l + \Delta X_l, \ldots, X_{p+1}+z_{p+1}, \ldots, X_m+z_m)}{k}\right)$$

$$(p = 1 \ldots n-1, x = 1 \ldots k)$$

$$Ca_x(X_l + \Delta X_l, \ldots, X_{p+1}+z_{p+1}, \ldots, X_m+z_m) = \quad (8)$$
$$\frac{|C_{x\,target} - C_x(X_l + \Delta X_l, \ldots, X_{p+1}+z_{p+1}, \ldots, X_m+z_m)|}{(USL_x - LSL_x)/2}$$

wherein $Ca_x(X_l+z_l, \ldots, X_{p+1}+z_{p+1}, \ldots, X_m+z_m)$ are capacitance off-target factors of different metal layers from the bottom metal layer "1" to the top metal layer "m" corresponding to the MOM capacitor combination Cx; $C_x(X_l+z_l, \ldots, X_{p+1}+z_{p+i}, \ldots, X_m+z_m)$ is the capacitance value of the MOM capacitor combination Cx when the thicknesses of the metal layers in the MOM capacitor are zl to zm.

After determining the updated target thicknesses for all the metal layers to be formed subsequently, performing the following process steps to the current metal layer such as forming a next insulating layer and conductive metal interconnects therein, forming a next interlayer dielectric on the next insulating layer and etching the next interlaying dielectric to form dielectric patterns, depositing metal on the next interlayer dielectric and in the dielectric patterns, and performing CMP. After that, re-designing the target thicknesses for all the metal layers to be formed on the next metal layer, and so on, so as to complete the fabrication for all the metal layers of the interconnect structure to make the total actual thickness be equal to the predetermined total target thickness for all the metal layers.

Figure 3:
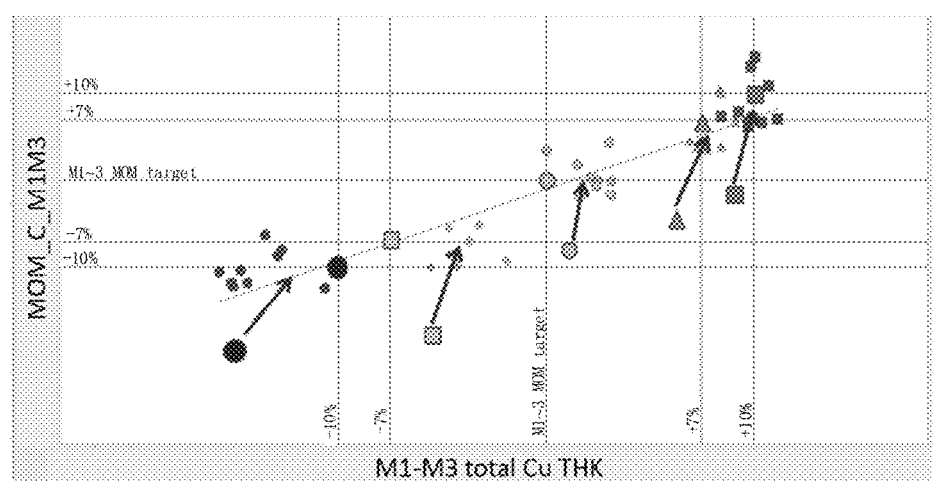
FIG. 3 is a diagram illustrating the relationship between the MOM capacitor and the total thickness of the metal layers.

Please refer to FIG. 3, which illustrates a new tape out process for a product (the first-time manufacturing process for a new product) during which the first metal layer M1 is manufactured thinner than predetermined, if the other metal layers on the first metal layer are manufactured to reach the original target thicknesses, the target capacitance value of the MOM capacitor combinations for the wafer cannot be achieved. By contrast, according to the present invention, the target thicknesses for all the metal layers are dynamically adjusted, which makes the total thickness of all the metal layers approximate or equal to the total target thickness of the metal layers, and achieves better process window distribution for the MOM capacitors. Although the process window for each metal layer may not be the same due to pattern layout or process design, the relationship between the process windows of adjacent metal layers can be accurately acquired according to the present invention. Therefore, during the actual process, the metal layer with larger process window can be designed to have a greater thickness or be subjected to more rework probability, so as to reduce the process difficulty and CMP rework probability for metal layers with small process windows and decrease the process cost.

The present embodiment also provides a system for MOM capacitance value control. The system comprises a storage module, a measurement module, a determination module, and a calculation module. The storage module stores target thicknesses for all metal layers. The measurement module measures a thickness of a current metal layer after the formation of the current metal layer. The determination module outputs a calculation signal when the thickness of the current metal layer is equal to or less than a threshold value or outputs a rework signal when the thickness of the current metal layer is greater than the threshold value. The calculation module responds to the calculation signal to calculate multiple capacitance variations related to the current metal layer according to the thickness of the current metal layer; wherein each of the capacitance variation related to the current metal layer is between an actual capacitance value of a MOM capacitor combination associated with the current metal layer and a target capacitance value of the same MOM capacitor combination. The calculation module further calculates updated target thicknesses for all subsequent metal layers according to the capacitance variations related to the current metal layer to reduce total variations between the actual capacitance values of the MOM capacitor combinations associated with the current metal layer and the target capacitance values of the same MOM capacitor combinations Herein, each MOM capacitor combination associated with the current metal layer is consisted of multiple MOM capacitors of multiple metal layers including the current metal layer; the capacitance variations related to the current metal layer and their compensation values are represented as the following first equation:

$$\begin{cases} C_1: \sum_{l_1}^{P} S_{1i}\Delta X_{1i} = -\sum_{P+1}^{m_1} S_{1j}\Delta X_{1j} \\ \vdots \\ C_k: \sum_{l_k}^{P} S_{ki}\Delta X_{ki} = -\sum_{P+1}^{m_k} S_{kj}\Delta X_{ki} \end{cases} \quad (1)$$

wherein $C_1$ to $C_k$ are MOM capacitor combinations associated with the current $p^{th}$ metal layer, $\Delta X$ is the variation between an actual thickness of a metal layer and a target thickness of the metal layer; S is the sensitivity of the metal layer to the MOM capacitor value; $l_1$ to $l_k$ are metal layers each of which is a bottom metal layer of all the metal layers consisting the corresponding MOM capacitor combination; $m_1$ to $m_k$ are metal layers each of which is a top metal layer of all the metal layers consisting the corresponding MOM capacitor combination.

The calculation module calculates thickness variations of subsequently formed metal layers corresponding to different MOM capacitor combinations according to the first equation and a second equation, wherein the second equation is as follows:

$$\Delta X_{p+1} : \Delta X_{p+2} : \ldots : \Delta X_{m-1} : \Delta X_m = C_{p(p+1)} : C_{p(p+2)} : \ldots \\ : C_{p(m-1)} : C_{pm} \quad (2);$$

Herein, the second equation for each MOM capacitor combination associated with the current metal layer represents the relationship between different thickness variations of subsequently formed metal layers included in the MOM capacitor combination relative to their target thicknesses. Then the calculate module calculates thickness variations of subsequently formed metal layers corresponding to different MOM capacitor combinations according to the first equation and the second equation, defines a collection of candidate thickness variation values for each subsequently formed metal layer according to their different thickness variations corresponding to different MOM capacitor combinations including the subsequently formed metal layer, and selects an optimal value from the collection of candidate thickness variation values for each subsequently formed metal layer, so as to obtain the updated target thickness for all the subsequently formed metal layers Preferably, defines the collection of candidate thickness variation values by:

selecting a minimum value and a maximum value of the thickness variations and defining a first thickness variation range represented by the following third equation filtering some of the candidate target thickness according to constraint equations as follows:

$$\Delta X_n \in [\text{Min}(\Delta X_{nC_1}, \ldots, \Delta X_{nC_k}), \text{Max}(\Delta X_{nC_1}, \ldots \\ , \Delta X_{nC_k})] \quad (3);$$

establishing the fourth and fifth equations to define a second thickness variation range and a third thickness variation range for each subsequently formed metal layer:

$$\text{LSL}_n < X_n + \Delta X_n < \text{USL}_n (n=2 \ldots m) \quad (4)$$

$$\int_{\text{LSL}_n}^{X_n+\Delta X_n} p(X_n+\Delta X_n) d(X_n+\Delta X_n) \geq 0.997 (n=2 \ldots m) \quad (5);$$

wherein, $\text{LSL}_n$ is the lower specification limit for the thickness of the $n^{th}$ metal layer, $\text{USL}_n$ is the upper specification limit for the thickness of the $n^{th}$ metal layer, $X_n + \Delta X_n$ is the updated target thickness of the $n^{th}$ metal layer, $P(X_n + \Delta X_n)$ is the probability density function of the updated target thickness of the $n^{th}$ metal layer;

calculating a maximum thickness variation value, a minimum thickness variation value, and multiple other thickness variation values therebetween by intersection of the first thickness variation range, the second thickness variation range and the third thickness variation range; wherein, the maximum thickness variation value, the minimum thickness variation value, and the multiple other thickness variation values form the collection of candidate thickness variation values.

The calculation module calculates arithmetic mean values of different capacitance off-target factors corresponding to different MOM capacitor combinations associated with the current metal layer by selecting different values from the collections of candidate thickness variation values of different subsequently formed metal layers, and obtains the updated target thicknesses of the subsequent metal layers by adding optimal candidate thickness variation values of different subsequently formed metal layers to the pre-set target thickness of the subsequently formed metal layers respectively, wherein the optimal candidate thickness variation values are obtained when the arithmetic mean value is minimum; the optimal candidate thickness variation values satisfy the following seventh equation and eighth equation:

$$(\Delta X_{p+1}, \ldots, \Delta X_n) = (z_{p+1}, \ldots, z_n), \quad (7)$$

$$\text{when } \frac{\sum_{1}^{k} Ca_x(z_l, \ldots, z_m)}{k} = \text{Min}\left(\frac{\sum_{t}^{k} Ca_x(z_l, \ldots, z_m)}{k}\right) p \in (1, n-1), x \in (1, k)$$

$$Ca_x(z_l, \ldots, z_m) = \frac{|C_{x\,target} - C_x(z_l, \ldots, z_m)|}{(USL_x - LSL_x)/2} \quad (8)$$

Wherein $Ca_x(z_l, \ldots, z_m)$ are capacitance off-target factors of different metal layers from the bottom metal layer "l" to the top metal layer "m" corresponding to the MOM capacitor combination Cx; $C_x(z_l, \ldots, z_l)$ is the capacitance value of the MOM capacitor combination Cx when the thickness of the metal layers in the MOM capacitor are zl to zm; "z" is the thickness of the metal layer which is the sum of the pre-set target thickness and the thickness variation.

After the formation of each metal layer, the target thicknesses of all the other metal layers to be formed above the metal layer are re-design by the MOM capacitance value control system, such that the total thickness of all the metal layers can meet the requirement and the MOM capacitance value can be controlled within the target capacitance range.

The above is only the preferred embodiment of the invention, the example is not intended to limit the scope of patent protection. Accordingly, all equivalents of structural changes using the specification and drawings of the present invention should be included within the scope of the present invention.

The invention claimed is:

1. A method for MOM capacitance value control, which comprises the following steps:
   S01: setting a target thicknesses for each metal layers;
   S02: after forming a current metal layer, measuring a thickness of the current metal layer; when the thickness of the current metal layer is equal to or less than a threshold value, then turning to step S03;
   S03: calculating multiple capacitance variations related to the current metal layer according to the thickness of the current metal layer; wherein each of the capacitance variation related to the current metal layer is between an actual capacitance value of a MOM capacitor combination associated with the current metal layer and a target capacitance value of the same MOM capacitor combination;
   S04: calculating updated target thicknesses for all subsequent metal layers according to the capacitance variations related to the current metal layer to reduce total variations between the actual capacitance values of the MOM capacitor combinations associated with the current metal layer and the target capacitance values of the same MOM capacitor combinations.

2. The method according to claim 1, wherein when the thickness of the current metal layer is greater than the threshold value, then performing a chemical mechanical polishing process to the current metal layer until the thickness of the current metal layer is equal to or less than the threshold value.

3. The method according to claim 1, wherein each MOM capacitor combination associated with the current metal layer is consisted of multiple MOM capacitors of multiple metal layers including the current metal layer; the capacitance variations related to the current metal layer and their compensation values are represented as the following first equation:

$$\begin{cases} C_1: \sum_{l_1}^{p} S_{n_1} \Delta X_{n_1} = -\sum_{p+1}^{m_1} S_{n'_1} \Delta X_{n'_1} \\ \quad \vdots \\ \quad \vdots \\ C_k: \sum_{l_k}^{p} S_{n_k} \Delta X_{n_k} = -\sum_{p+1}^{m_k} S_{n'_k} \Delta X_{n'_k} \end{cases}$$

wherein $C_1$ to $C_k$ are MOM capacitor combinations associated with the current $p^{th}$ metal layer, $\Delta X$ is the variation between an actual thickness of a metal layer and a target thickness of the metal layer; S is the sensitivity of the metal layer to the MOM capacitor value; $l_1$ to $l_k$ are metal layers each of which is a bottom metal layer of all the metal layers consisting the corresponding MOM capacitor combination; $m_1$ to $m_k$ are metal layers each of which is a top metal layer of all the metal layers consisting the corresponding MOM capacitor combination.

4. The method according to claim 3, wherein step S4 further comprises the following steps:
   S41: establishing a second equation for each MOM capacitor combination associated with the current metal layer which represents the relationship between different thickness variations of subsequently formed metal layers included in the MOM capacitor combination relative to their target thicknesses, the second equation is as follows:

$$\Delta X_{p+1}:\Delta X_{p+2}:\ldots:\Delta X_{m-1}:\Delta X_m = C_{p(p+1)}:C_{p(p+2)}:\ldots :C_{p(m-1)}:C_{pm};$$

wherein Cp is the process capability index of the metal layer;
   S42: calculating thickness variations of subsequently formed metal layers corresponding to different MOM capacitor combinations according to the first equation and the second equation;
   S43: for each subsequently formed metal layer, defining a collection of candidate thickness variation values according to their different thickness variations corresponding to different MOM capacitor combinations including the subsequently formed metal layer;
   S44: selecting an optimal value from the collection of candidate thickness variation values for each subsequently formed metal layer, so as to obtain the updated target thickness for all the subsequently formed metal layers.

5. The method according to claim 2, wherein step S43 further comprises the following steps:
   S431: for each subsequently formed metal layer, selecting a minimum value and a maximum value of the thickness variations calculated in step S42 and defining a first thickness variation range represented by the following third equation:

$$\Delta X_n \in [\text{Min}(\Delta X_{nC_1}, \ldots, \Delta X_{nC_k}), \text{Max}(\Delta X_{nC_1}, \ldots, \Delta X_{nC_k})];$$

S432: establishing fourth and fifth equations to define a second thickness variation range and a third thickness variation range for each subsequently formed metal layer:

$LSL_n < X_n + \Delta X_n < USL_n (n=2 \ldots m)$;;

$\int_{LSL_n}^{X_n+\Delta X_n} P(X_n+\Delta X_n) d(X_n+\Delta X_n) \geq 0.997 (n=2 \ldots m)$;

wherein, $LSL_n$ is the lower specification limit for the thickness of the $n^{th}$ metal layer, $USL_n$ is the upper specification limit for the thickness of the $n^{th}$ metal layer, $X_n + \Delta X_n$ is the updated target thickness of the $n^{th}$ metal layer, $P(X_n + \Delta X_n)$ is the probability density function of the updated target thickness of the $n^{th}$ metal layer;

S433: calculating a maximum thickness variation value, a minimum thickness variation value, and multiple other thickness variation values therebetween by intersection of the first thickness variation range, the second thickness variation range and the third thickness variation range; wherein, the maximum thickness variation value, the minimum thickness variation value, and the multiple other thickness variation values form the collection of candidate thickness variation values.

6. The method according to claim 1, wherein step S44 comprises calculating arithmetic mean values of different capacitance off-target factors corresponding to different MOM capacitor combinations associated with the current metal layer by selecting different values from the collections of candidate thickness variation values of different subsequently formed metal layers, and obtaining the updated target thicknesses of the subsequent metal layers according to optimal candidate thickness variation values of different subsequently formed metal layers which are obtained when the arithmetic mean value is minimum; the optimal candidate thickness variation values satisfy the following equations:

$(\Delta X_{p+1}, \ldots, \Delta X_n) = (z_{p+1}, \ldots, z_n)$, when $\dfrac{\sum_{1}^{k} Ca_x(X_l + \Delta X_l, \ldots, X_{p+1} + z_{p+1}, \ldots, X_m + z_m)}{k} =$ $\mathrm{Min}\left(\dfrac{\sum_{1}^{k} Ca_x(X_l + \Delta X_l, \ldots, X_{p+1} + z_{p+1}, \ldots, X_m + z_m)}{k}\right)$ $(p = 1 \ldots n-1, x = 1 \ldots k)$;

$Ca_x(X_l + z_l, \ldots, X_{p+1} + z_{p+1}, \ldots, X_m + z_m) =$ $\dfrac{|C_{x\,target} - C_x(X_l + z_l, \ldots, X_{p+1} + z_{p+1}, \ldots, X_m + z_m)|}{(USL_x - LSL_x)/2}$;

wherein $Ca_x(X_l + z_l, \ldots, X_{p+1} + z_{p+1}, \ldots, X_m + z_m)$ are capacitance off-target factors of different metal layers from the bottom metal layer "1" to the top metal layer "m" corresponding to the MOM capacitor combination Cx; $C_x(X_l + z_l, \ldots, X_{p+1} + z_{p+1}, \ldots, X_m + z_m)$ is the capacitance value of the MOM capacitor combination Cx when the thicknesses of the metal layers in the MOM capacitor are zl to zm.

7. The method according to claim 1, wherein the metal layer is formed by the following steps:
    depositing a dielectric layer and forming vias and trenches in the dielectric layer;
    depositing a metal layer by PVD or CVD or electroplating;
    performing CMP to pattern structures formed after the above steps.

8. The method according to claim 1, wherein the thickness of the current metal layer is measured by an optical microscope, a spectroscopic ellipsometer or a scanning electron microscope.

* * * * *